United States Patent
Travaglini

(10) Patent No.: US 10,389,323 B2
(45) Date of Patent: Aug. 20, 2019

(54) CONTEXT-AWARE LOUDNESS CONTROL

(71) Applicant: TLS Corp., Cleveland, OH (US)

(72) Inventor: Alessandro Travaglini, Ludwigsburg (DE)

(73) Assignees: TLS CORP., Cleveland, OH (US); Alessandro Travaglini, Baden-Württemberg (DE)

( * ) Notice: Subject to any disclaimer, the term of this patent is extended or adjusted under 35 U.S.C. 154(b) by 44 days.

(21) Appl. No.: 15/845,894

(22) Filed: Dec. 18, 2017

(65) Prior Publication Data

US 2019/0190477 A1     Jun. 20, 2019

(51) Int. Cl.
  *H03G 3/32*   (2006.01)
  *H03G 3/30*   (2006.01)
  *H03G 5/16*   (2006.01)

(52) U.S. Cl.
  CPC ............. *H03G 3/32* (2013.01); *H03G 3/3005* (2013.01); *H03G 5/165* (2013.01)

(58) Field of Classification Search
  CPC ......... H03G 3/32; H03G 3/3005; H03G 5/165
  (Continued)

(56) References Cited

U.S. PATENT DOCUMENTS 8,437,482 B2 * 5/2013 Seefeldt .................. G10L 25/48
                                                            381/104
9,584,083 B2   2/2017 Seefeldt et al.
(Continued)

FOREIGN PATENT DOCUMENTS

EP       2002429 B1    11/2012
WO    2009113046 A2     9/2009
(Continued)

OTHER PUBLICATIONS

AES Convention Paper 6161, "Evaluation of Objective Loudness Meters", G.A.Soulodre.

(Continued)

*Primary Examiner* — Vivian C Chin
*Assistant Examiner* — Douglas J Suthers
(74) *Attorney, Agent, or Firm* — Renner, Otto, Boisselle & Sklar, LLP

(57) ABSTRACT

Context-aware loudness control of audio content may include choosing from a plurality of loudness level models based on an audio reproduction device, measuring loudness level of the audio content based on the chosen loudness model, processing the real-time loudness measurement of the input audio signal to output real-time loudness level adjustment, processing a momentary loudness measurement of the input audio signal to output a momentary loudness level adjustment, processing a short-term loudness measurement of the input audio signal to output a short-term loudness level adjustment, adjusting the input audio signal based on the real-time, momentary, and short-term loudness level adjustments to output a post-processing input signal, measuring long-term loudness of the post-processing input signal to output a long-term loudness measurement, processing the long-term loudness measurement to output a post-processing level adjustment, and processing the real-time, momentary, short-term, and post-processing level adjustments to output an overall loudness level adjustment.

18 Claims, 4 Drawing Sheets

(58) Field of Classification Search
USPC .................................. 381/57, 56, 104, 107
See application file for complete search history.

(56) References Cited

U.S. PATENT DOCUMENTS

| | | |
|---|---|---|
| 9,705,461 B1 | 7/2017 | Seefeldt |
| 2005/0078840 A1 | 4/2005 | Riedl |
| 2008/0253586 A1* | 10/2008 | Wei .................. H03G 5/165 381/107 |
| 2010/0272290 A1* | 10/2010 | Carroll ............ H03G 3/3089 381/107 |
| 2015/0078585 A1* | 3/2015 | Reilly ................ H03G 7/002 381/107 |

FOREIGN PATENT DOCUMENTS

| | | | |
|---|---|---|---|
| WO | 2014057442 A2 | 4/2014 | |
| WO | 2014147081 A1 | 9/2014 | |

OTHER PUBLICATIONS

ITU-R.BS1770-4 Algorithms to measure audio programme loudness and true-peak audio level.
Brian C.J.Moore, "An Introduction to the Psychology of Hearing, fifth edition", Elsevier 2006.
David M.Howard, James A.S.Angus, "Acoustics and Psychoacoustics, fourth edition", Focal Press 2009.

* cited by examiner

CONTEXT-AWARE LOUDNESS CONTROL

BACKGROUND

Programming such as television programs or theatrical feature films is, in many cases, produced with variable loudness and wide dynamic range to convey emotion or a level of excitement in a given scene. For example, a movie may include a scene with the subtle chirping of a cricket and another scene with the blasting sound of a shooting cannon. Interstitial material such as commercial advertisements, on the other hand, is very often intended to convey a coherent message, and is, thus, often produced at a constant loudness, narrow dynamic range, or both. Other type of content, such as news gathering, documentaries, children programming, modern music, classical music, live talk-shows, etc., may have inconsistent loudness levels or unpredictable loudness ranges.

Conventionally, annoying disturbances occurred at the point of transition between the various programming, and often between the programming and the interstitial material. This is commonly known as the "loudness inconsistency problem" or the "loud commercial problem." In some cases, even when switching between programming and interstitial material that had matched average loudness and dynamic range, the loudness of the programming may decrease for artistic reasons for a period of time, possibly enough time to cause users to increase the volume of the audio. When this quieter-than-average section of the program switched to interstitial material that matched the original average loudness of the programming, the interstitial material may be too loud due to the increase in volume by the user.

This loudness inconsistency problem is experienced by TV viewers, radio listeners, and any other media user (such as web media, streaming, mobile, OTT, portable player, in-flight entertainment, etc.) when the reproduced content (or a sequence of different content) generates inconsistent, uncomfortable, or annoying sound pressure levels. Another example is a feature film being transmitted on TV or on a mobile device. Because of the way the film was initially produced for the theatrical representation, the modulation of its loudness levels would exceed the hearing comfort zone when reproduced in a home environment via a consumer device such as a TV set or a mobile device. The viewer/listener would have to repeatedly control the volume level of the device in order to make soft levels audible (like dialogs) and loud levels not annoying (like action scenes with loud music and sound effects).

Conventionally, processes addressing the loudness inconsistency problem modified the audio itself and at its source, thus making the processes irreversible. However, not all viewers may desire to have the programming audio changed in such a way. Furthermore, the user device could be used to retransmit the live stream to any other consumer device, rather than to reproduce the content itself. Consequently, reducing the dynamic range for fulfilling the audio characteristics of the receiver would generate a useless audio quality degradation in case the final reproduction device was capable of supporting larger dynamics or frequency range. Due to the variety of possible distribution platforms, predicting how a programming would be ultimately reproduced is no longer possible, and any audio processing applied beforehand could result inappropriate to the specific listening scenario.

Also conventionally, processes addressing the loudness inconsistency problem introduced sound artifacts or alterations to the spectral balance of the source content. These issues diminish the listener's experience.

SUMMARY

Context-aware loudness control of an audio stream may include processing the input audio signal in real-time based on a real-time loudness level adjustment, a momentary loudness level adjustment, a short-term loudness level adjustment, and a post-processing level adjustment to output an overall loudness level adjustment. The input audio signal may then be processed based on the overall loudness level adjustment to generate an output audio signal to be reproduced by the audio reproduction device.

Context-aware loudness control improves over prior art technology at least in that it controls based on psychoacoustic models and thus it emulates how human hearing works. It also improves over prior art technology in that it automatically and adaptively drives loudness level processing depending on real-time loudness analysis, on the specific audio reproduction device, and the listening scenario. The disclosed control does not apply dynamics processing to audio transients and does not rely on any compression or expansion technology that applies level gain to the source audio level. It only applies adaptation of its loudness component. Thus, the disclosed control preserves original sound quality and does not introduce spectral artifacts that degrade the audio.

The disclosed control is specifically designed to assess the loudness characteristic of an audio program and to hit the target loudness range and loudness level set for the specific use case (TV, Radio, Streaming, Inflight, Gaming, Car-Audio, etc.) It achieves the required target loudness range and target program loudness level while applying only the required amount of processing. This means that it does not reduce the loudness range if not necessary while it achieves loudness standard compliance. It automatically adapts its setting upon real-time assessment of the input signal and depending on the defined destination medium, reproduction device, or user's taste. Not affecting the source asset, but rather only processing the output signal, it allows parallel non-destructive operations, and thus concurrently accommodates multiple user scenarios. Furthermore, off-line processing is also supported.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
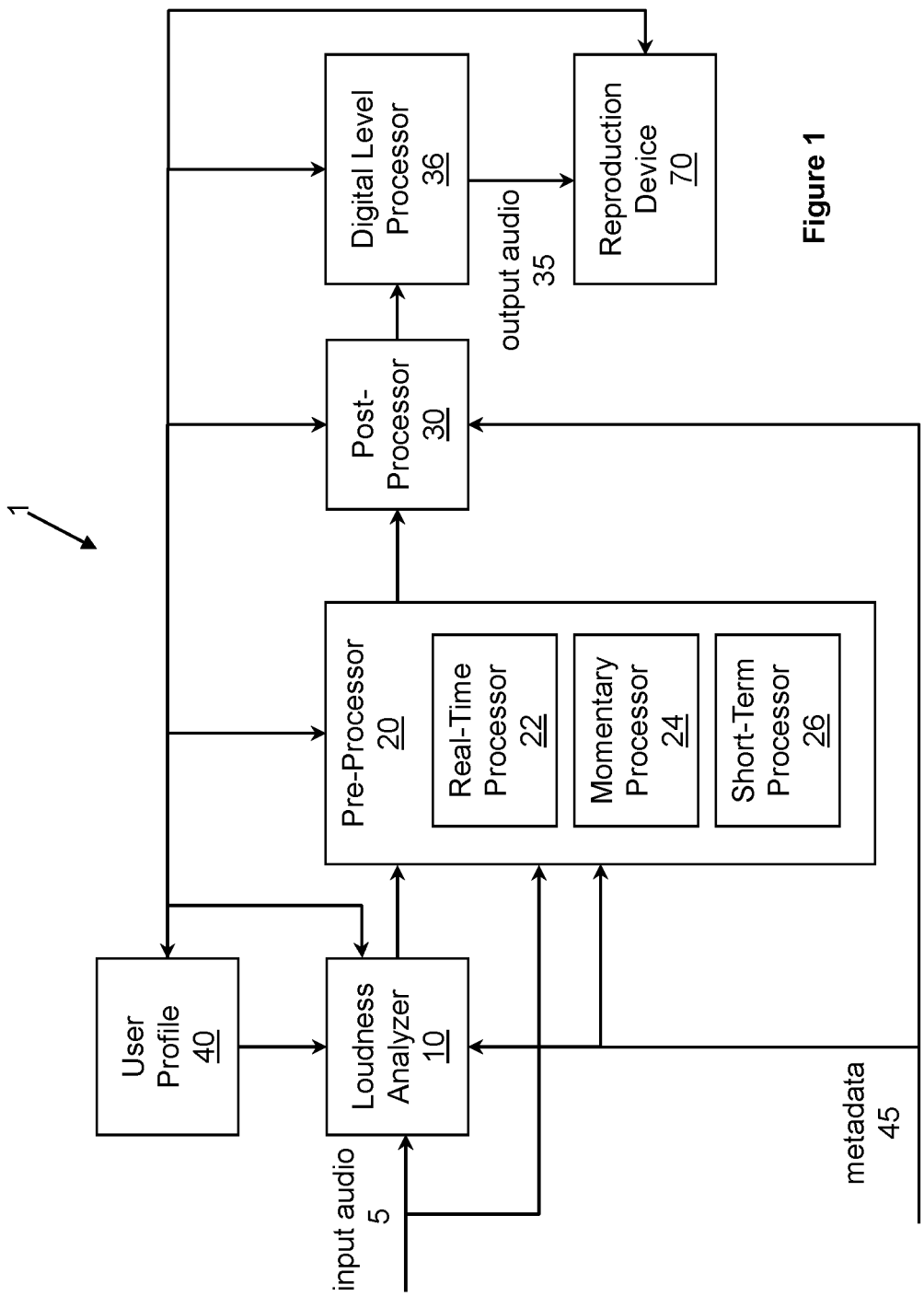
FIG. 1 illustrates a high level block diagram of an exemplary system for providing context-aware loudness control of audio content.

Context-aware loudness control is based on psychoacoustic models to intelligently adapt loudness levels of audio content in real-time in order to hit a specific average target loudness level as well as to maintain the level range within a comfortable zone as perceived by the user. Where required, it consistently and adaptively modifies the loudness levels of source audio content in order to accommodate the technical requirement of the content provider/broadcaster/distributor or the listening preference of the final user. This may be accomplished by adapting loudness depending on the destination listening environment and/or the audio reproducing device. Context-aware loudness control may modify loudness levels according to pre-defined settings or according to custom adjustments operated by the user or system administrator, and depending on the reproducing device and/or its environment. This type of control is effective on real-time audio as well as on pre-stored audio. Similar technology as described herein in the context of real-time audio may be utilized offline to adapt pre-existing audio assets in a faster-than-real-time implementation. Since, for the pre-existing audio, we do not have to wait for the audio to produced (or reproduced), the pre-existing audio may be adapted all at once or at least significantly faster than if we were waiting for production (or reproduction) of the audio.

The term "real-time" or an operation occurring in "real-time" as used herein means that an operation is executed approximately within the time range of being perceived as immediate by a human being (i.e., the minimum sound duration necessary to human hearing to assess loudness). Studies claim that in regard to loudness perception this duration is approximately 200 ms.

The term "momentary measurement" as used herein means that the measurement is executed on the sliding window across the number of audio samples obtained as multiple of the number of audio samples defined for the computation of real-time measurement (Real-Time Measurement Window). Momentary measurement does not refer to similar parameters used in the audio literature where it is typically used to represent loudness level of very short program parts, from 50 to 500 ms (usually 400 ms). In fact, in the present disclosure it is also possible to use momentary measurement, and the consequent processing, to add a second pass of real-time processing, by means of setting the momentary measurement multiplier to 1. "Momentary processing" is the loudness adaptation applied after real-time processing based on the momentary measurement values.

The term "short-term measurement" as used herein means that the short-term measurement is executed on the sliding window across the number of audio samples obtained as multiple of the number of audio samples defined for the computation of real-time measurement (Real-Time Measurement Window). Short-term measurement does not refer to similar parameters used in the audio literature where it is typically used to represent loudness level of short program parts, from 500 ms to 10 seconds (usually 3 seconds). In fact, in the present disclosure it is also possible to use short-term measurement, and the consequent processing, to add a third pass of real-time processing, by means of setting the short-term measurement multiplier to 1. "Short-term processing" is the loudness adaptation applied after momentary processing based on the short-term measurement values.

The term "long-term measurement" as used herein means that the measurement is executed on the sliding window across the duration defined by the post-processing size. Long-term measurement is typically executed across a significant program part of which duration is sufficient to determine the average loudness level of the program. In the present disclosure, long-term measurement is used to compute the overall gain adaptation necessary to achieve loudness standard compliance. This duration is typically larger than 30 seconds. In the present disclosure, long-term measurement does not refer to similar parameters used in the audio literature.

Context-aware loudness control may be implemented in professional equipment such as transmitters, online distributors, plug-ins, audio-video hardware, audio mixers, digital-audio-workstations, video editing suites, radio workstations, music mixers, audio processors, servers and software, etc. as well as in commercial and home devices such as portable players, smart-phones, smart-TV sets, computers, tablets, hi-fi, home-cinema, car audio, gaming consoles, etc. Context-aware loudness control may be implemented for any type of programming including TV, radio, Public Address, live music, theatre, cinema, gaming, in-flight entertainment, web-streaming, internet cloud, Virtual Reality, etc., and any other production, distribution, transmission, or reproduction implementation where audio is involved. Loudness measurement and processes involved in context-aware loudness control are applicable to any sort of audio format (mono, stereo, multichannel, immersive, etc.)

FIG. 1 illustrates a high-level block diagram of an exemplary system 1 for providing context-aware loudness control of audio content. The system 1 may be organized in three macro modules: loudness analyzer 10, loudness pre-processor 20 (including real-time processor 22, momentary processor 24, and short-term processor 26) and post-processor 30. Upon proper setting, its processing may provide full loudness standard compliance according to the most common audio recommendations (e.g., ITU BS.1770-4).

Unlike other technologies used to process audio levels, the system 1 does not rely on any traditional audio level dynamics processing tool such as an audio compressor, automatic gain control (AGC), or expander based on audio signal magnitude control. This approach prevents the system 1 from introducing audio artifacts and sound degradation to the input audio signal 5, allows tailored control on loudness parameters, and significantly improves the listening experience.

The system 1 is based on psychoacoustic loudness models that analyze all main aspects involved in human hearing: frequency, intensity, duration, masking and sound source direction. It extracts the loudness components of the audio asset 5 and intelligently adapts them in order to produce a comfortable listening experience with consistent average levels, without negatively affecting the output audio signal 35. Unlike prior solutions, the system 1 relies on optimized processing that is capable of properly defining the ideal amount of required adaptation depending on input loudness levels, destination listening environment, reproducing device, and user's preferences. Since it is based on real-time non-destructive operations, multiple reversible processing can be operated concurrently, by means of several parallel units or systems.

The system 1 may also include the user profile 40 or profile menu, which stores profile settings that define how other portions of the system 1 operate. It communicates with the loudness analyzer 10, real-time processor 22, momentary processor 24, short-term processor 26, and post-processor 30. The user profile 40 may also communicate with the digital level processor 36 and reproduction device 70 of FIG. 2 as described below. The profile settings can be either defined/recalled by the user, automatically recalled by the reproduction device 70 or by metadata included in the audio stream. The profile menu 40 may store several data necessary to process the audio signal according to the following aspects:

user's preference
reproduction device
content metadata

User profiles may include universal profile, genre-oriented profiles (e.g., movie, music, news, etc.), as well as dialog-centric or agnostic adaptation profiles. The user profile 40 may store as settings one or more psychoacoustic loudness models and communicate the settings to the loudness meter 10, the pre-processor 20, the real-time processor 22, the momentary processor 24, the short-term processor 26, the long-term loudness meter 32, the post-processor 30, and the digital level processor 36 such that they may perform based on the selected loudness model.

The system 1 may be integrated in an automated workflow or may be accessed via a control panel interface of the user profile 40 that sets the amount of targeted adaptation. This user profile 40 may be made available as a user's device application, allowing the user to customize his/her listening experience according to his/her own personal taste.

In one embodiment, the user profile 40 selects the loudness model from various loudness models based on the kind of the audio reproduction device (e.g., TV, radio, mobile phone, etc.) or the environment of the audio reproduction device (e.g., home, theatre, vehicle, etc.) Therefore, depending on the destination medium/device used to reproduce the audio program, the system 1 may define how loudness levels are measured and applied in real-time to the level gain control with the goal of providing adequate adaptation and achieve standard compliance.

The profiles menu 40 may also communicate with the audio reproduction device 70, and select the loudness model from the plurality of loudness models based on at least one of a kind of the audio reproduction device or a measurement of an environment of the audio reproduction device.

As a result, the system 1 allows the user (or the content supplier/broadcaster/distributor) to select what profile or setting to be used for loudness processing. Profile's settings may be customized, saved, and recalled as user's settings.

The loudness analyzer 10 may split the input audio signal 5 into small slices which have a duration defined by the Real-Time Measurement Window as described below. Loudness levels of these audio slices may be measured with various integration times (real-time, momentary, short-term) and the gathered loudness values may be used by the pre-processor 20 to define how much level gain or attenuation should be applied to the input audio signal 5 in order to match with the target level.

The pre-processor 20 receives the input audio signal 5 and processes the input audio signal 5 to output a post-processing input signal PPIS. The pre-processor's gains may be further controlled and weighted by several additional parameters that aim at providing a smooth processing and at achieving the expected overall loudness range. After the pre-processor 20 the average program loudness level is measured again and the resulting value is used by the post-processor 30 to achieve standard compliance.

The system 1 may detect the specific amount of loudness correction required by acting on the micro and macro dynamics modulations of the input audio signal 5. This way the mixing balance between voice, sound effects and music may be improved, resulting in increased dialog intelligibility, especially on devices where that aspect might be critical (e.g., inflight, mobile phones).

Also, by using loudness metadata 45 including, for example, loudness status, program level, dialog level, loudness range, real-time loudness level, and program duration, the system 1 may keep full control of any audio transmission while complying with international loudness recommendations.

Figure 2:
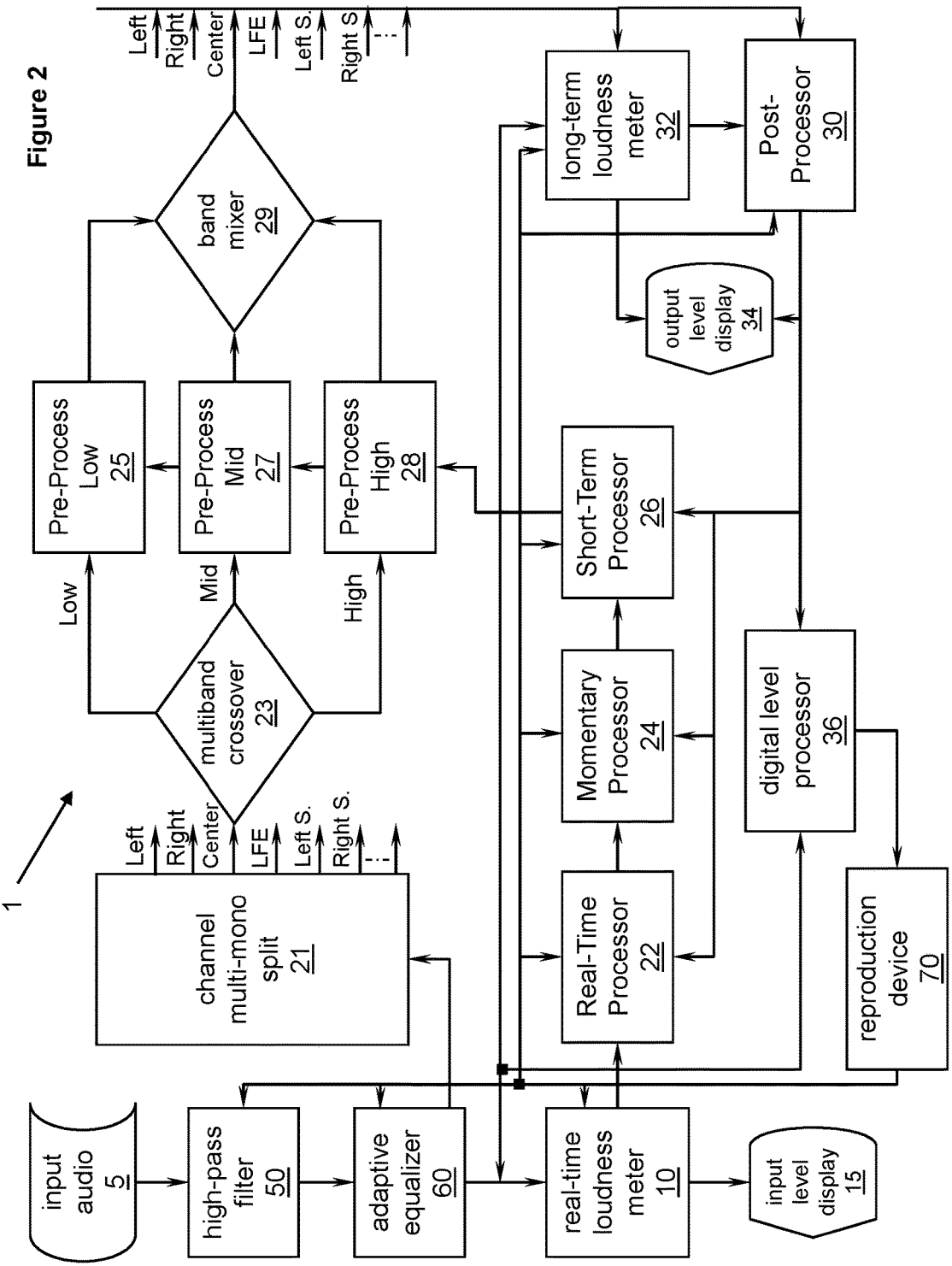
FIG. 2 illustrates a detailed block diagram of the exemplary system for providing context-aware loudness control of audio content.

FIG. 2 illustrates a detailed block diagram of the exemplary system 1 for providing context-aware loudness control of audio content. The system 1 may be implemented in a machine (e.g., home audio receiver, TV, mobile phone, car-audio, etc.) or distributed among a group of machines. The system 1 receives incoming original audio assets consisting of, for example, audio signal, secondary event messages, and metadata. The audio assets may be passed to the high-pass filter 50 and/or the adaptive equalizer 60 while the secondary event messages and metadata may be passed to the loudness meter 10, the digital level processor 36, and the profiles menu 40. This data may be used to recall/modify profile settings, to restart the loudness measurement and the loudness processors, or to set the loudness metadata of the digital level processor 36 on the Content Loudness Metadata (CLM) value if present, as explained below.

The system 1 may include a high-pass filter 50 that receives the input audio signal 5 and filters out low frequencies according to the parameter Audio High Pass (AHP): Cutoff Frequency (e.g., Hz) of the high pass filter.

The system 1 may also include the adaptive equalizer 60 that passes the filtered audio to the loudness meter 10 for measurement purposes and to the digital level processor 36 for level adaptation. The adaptive equalizer 60 may receive an audio asset and sound pressure level information from the audio reproduction device 70 as generated by the electroacoustic transducing system and process the audio asset based on the sound pressure level information. The adaptive equalizer 60 is particularly relevant to consumer devices. In the commercial user's device (e.g., mobile phone, TV, home receiver, etc.) only the user can operate the volume control of the reproduction device 70 in order to set the volume level (SPL) of the reproduction. This information may be passed to the adaptive equalizer 60. The adaptive equalizer 60 receives the audio asset from the audio stream and SPL Level information from the reproduction device 70. It may then smoothly process the frequency balance of the incoming audio content in order to balance the variation of loudness perception occurring at different SPL levels. This provides the best sonic experience to the listener because it compensates for the loss of energy at high and low frequencies occurring at low SPL values. The information generated by the reproduction device 70 in regard to output volume setting are also passed to the real-time loudness meter 10 which adapts its measurement filters accordingly in order to take into account the actual SPL generated by the consumer device 70.

The loudness meter 10 measures loudness of the input audio signal based on a loudness model and outputs loudness levels of the input audio signal. The loudness meter 10 may assess the loudness levels of the audio content in real-time. The loudness meter 10 may select a loudness level model from a plurality of loudness models based on context such as the kind or type of the audio reproduction device 36.

The loudness meter 10 may also select a loudness level model from a plurality of loudness models as selected in the profile menu 40.

The loudness meter 10 may also receive loudness metadata from the input audio 5 and data from the user profile or profile menu 40. The loudness meter 10 may provide its output to the real-time processor 22 and the post-processor 30. The loudness meter 10 may also apply gating, voice detection, or other loudness measurement implementations.

In one embodiment, the loudness meter 10 applies 75% overlap in the measurement of the real-time loudness level and it may be reset in order to begin a new measurement.

The frequency weighting filters of the real-time Loudness Meter may be specific for different channel groups (e.g., up to 7.1+4 or more).

The system 1 may also include an input level display 15 that displays the loudness level as measured by the loudness meter 10.

The system 1 may also include the real-time processor 22, which receives and processes the real-time loudness level of the input audio signal and outputs a real-time loudness level adjustment. The real-time processor 22 gathers values of instantaneous loudness levels (RTL) as provided by the loudness meter 10 and, according to the settings received from the profile menu 40, computes the real-time loudness level adjustments that the digital level processor 36 should apply to the output. Absolute gating (e.g. −80 LUFS) may be applied to the measurement in order to hold the gain adaptation in case the incoming signal falls below such a threshold.

The system 1 may also include the momentary processor 24, which receives and processes a momentary loudness level of the input audio signal 5 as received from the loudness meter 10 or the real-time processor 22. The momentary processor 24 processes the momentary loudness level and outputs a momentary loudness level adjustment. The momentary processor 24 may gather momentary loudness values as provided at the output of the real-time processor 22 and, according to the Momentary Measurement Window size set in the profile menu 40, may compute the momentary loudness level adjustments that the digital level processor 36 should apply. Absolute gating (e.g. −80 LUFS) may be applied to the measurement in order to hold the gain adaptation in case the incoming signal falls below such a threshold.

The system 1 may also include the short-term processor 26, which receives a short-term loudness level of the input audio signal 5 from the loudness meter 10, the real-time processor 22, or the momentary processor 24, process the short-term loudness level, and output a short-term loudness level adjustment.

The short-term processor 26 may gather short-term loudness levels as provided at the output of the momentary processor 24 and, according to a short-term measurement window set received from the profile menu 40, compute the loudness level adjustments that the digital level processor 36 should apply. Absolute gating (e.g. −80 LUFS) may be applied to the measurement in order to hold the gain adaptation in case the incoming signal falls below such a threshold. Alternatively, the short-term processor 26 can be set with any size as a multiplier of the RTL window, and used to apply further serial real-time loudness adaptation.

The system 1 may also include a long-term loudness meter 32 that measures a long-term loudness of the post-processing input signal PPIS and outputs a long-term loudness level of the post-processing input signal. The system 1 may also include the post-processor 30, which receives and processes at least the long-term loudness level of the post-processing input signal to output a post-processing level adjustment. In addition to processing by the real-time processor 22, the momentary processor 24, and the short-term processor 26, the audio signal level may further be controlled via the post-processor 30 whose processing is based on a long-term loudness measurement (called LTL) performed on the post-processing input signal PPIS. PPIS is generated according to the adaptations computed by the whole pre-processor 20 (including the real-time processor 22, the momentary processor 24, and the short-term processor 26). The newly generated audio signal PPIS is only used to compute the required gain adaptation applied by the post-processor 30.

A brand new audio signal calculated at the output of the Pre-Processing module and is labeled PPIS (Post-Processing Input Signal). It is the result of the sum of the initial source audio signal (IS) and the gain adaptations RTG, MG, and STG computed by the individual Real-Time, Momentary, and Short-term sliding processors, respectively, used in the Pre-Processing module:

$$PPIS=IS+RTG+MG+STG$$

The LTL measurement may be performed on PPIS using a sliding window of the size defined by the Post-Processing Size (PPS), and in accordance of the selected measurement method (e.g., ITU-R.BS1770-4). It is used to compute the final Long-Term level processing necessary to smoothly align the Long-term Loudness Level to the Target Level. LTL measurement applies absolute gating at −70 LUFS. If LTL is below the absolute threshold Post-Processing gain may be put on hold. To assess the Long-term Loudness Level the post-processor 30 may optionally use relative gating (e.g., ITU-R.BS1770-2 onwards) or dialog detection, or other means of loudness assessment. To enable voice detection for computing LTL the parameter Voice Detection is set to 1.

The system 1 may also include an output level display 34 which displays the long-term loudness level as measured by the long-term loudness meter 32.

The reproduction device 70 is the actual user equipment which includes the system to transform the digital audio signal into sound waves. It is typically a portable media player, a TV-set, a Home-Theatre system, a mobile phone, a car-audio receiver, etc. It is not included in the signal-flow of the professional chain such as broadcasting, distribution, offline broadcasting, streaming, etc. The reproduction device 70 can communicate:

- the Volume Control Level to the adaptive equalizer 60, in order to balance the overall sonic characteristics of the audio content and to compensate the mismatch between the electroacoustic transducer and the human hearing perception, according to the generated sound pressure level.
- the Volume Control Level to the real-time loudness meter 10, in order to adapt the loudness analysis of the input signal to the human hearing as actually perceived according to the actual generated sound pressure level.
- the acoustic finger-print of the electroacoustic transducer to the profile menu 40 in order to automatically recall the most appropriate setting to pursue the best sonic experience according to the selected reproduction device 70.

The reproduction device 70 can further detect the noise level of the environment and accordingly automatically amend the profile settings in user profile 40 in order to provide the listener with consistent loudness levels and listening comfort.

The system 1 may also include a digital level processor 36 configured to receive and process the input audio signal 5, the real-time loudness level adjustment, the momentary loudness level adjustment, the short-term loudness level adjustment, and the post-processing level adjustment to output an overall loudness level adjustment based on which the input audio signal 5 may be processed to output the output audio signal 35 to be reproduced by the audio reproduction device 70. The overall loudness level adjustment is performed by the digital level processor 36 summing the individual computations performed by all processors and according to all the conditions previously defined. The digital level processor 36 processes the input audio signal 5 to output the output audio signal 35 to match a target loudness average level and a target loudness modulation within predetermined tolerance (e.g., 0.1 LU, 0.5 LU, 1 LU, 2 LU, 5 LU, etc.).

As stated above, the loudness analyzer 10 may split the input audio signal 5 into small slices which have a duration defined by the Real-Time Measurement Window. Loudness levels of these audio slices may be measured with various integration times and the gathered loudness values may be used by the pre-processor 20 to define how much level gain or attenuation should be applied to the input audio signal 5 in order to match with the target level.

The system 1 may include a channel split 21 that splits the audio signal into channels such as Left (L), Right (R), Center (C), Low Frequency Effect (LFE), Left Surround (Ls), Right Surround, (Rs), etc. so that each channel may be treated independently. FIG. 2 illustrates only the Center channel. Similar architecture is used for the other channels.

The system 1 may operate in Multiband Mode and Wideband Mode.

In Multiband Mode, the system 1 includes multiband crossovers 23 that split the channel source audio signal into several frequency bands (in the following description, as well as in FIG. 2, a 3-band model is depicted. Less or more bands could similarly apply to the described technology). Wideband Mode Enable (WME): enables/disables Wideband Mode.

Figure 3:
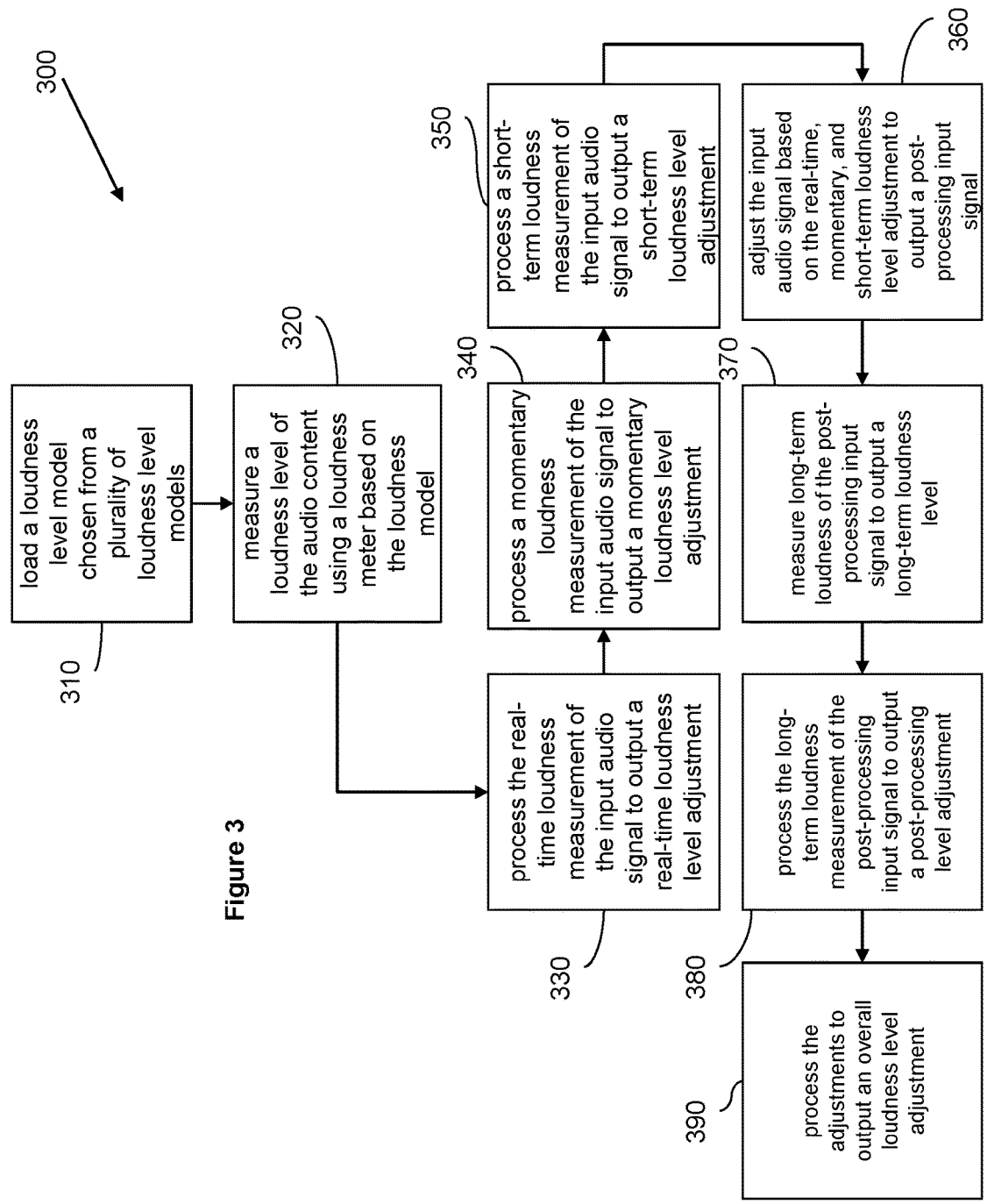
FIG. 3 illustrates a flow diagram of an exemplary method for providing context-aware loudness control of audio content.

Example methods may be better appreciated with reference to the flow diagrams of FIG. 3, which illustrates a flow diagram for an example method 300 for providing context-aware loudness control of audio content. At 310, the method 300 loads a loudness level model chosen from a plurality of loudness level models. The loudness level model may be chosen from the plurality of loudness models based on an audio reproduction device 70 to reproduce an output audio signal derived from the input audio signal 5. At 320, the method 300 includes measuring a loudness level of the audio content using a loudness meter 10 based on the loudness model from the plurality of loudness model to output at least real-time loudness level of the input audio signal.

At 330, the method 300 includes receiving and processing the real-time loudness measurement of the input audio signal to output a real-time loudness level adjustment. At 340, the method 300 receives and processes the momentary loudness measurement of the input audio signal to output a momentary loudness level adjustment. At 350, the method 300 includes receiving and processing a short-term loudness measurement of the input audio signal to output a short-term loudness level adjustment. At 360, the method 300 includes adjusting the input audio signal based on the real-time loudness level adjustment, the momentary loudness level adjustment, and the short-term loudness level adjustment to output a post-processing input signal.

At 370, the method 300 includes measuring a long-term loudness of the post-processing input signal to output a long-term loudness level of the post-processing input signal. At 380, the method 300 receives and processes the long-term loudness measurement of the post-processing input signal to output a post-processing level adjustment. At 390, the method 300 receives and processes the input audio signal, the real-time loudness level adjustment, the momentary loudness level adjustment, the short-term loudness level adjustment, and the post-processing level adjustment to output an overall loudness level adjustment based on which the input audio signal is to be processed to output the output audio signal to be reproduced by the audio reproduction device 70.

While FIG. 3 illustrates various actions occurring in serial, it is to be appreciated that various actions illustrated could occur substantially in parallel, and while actions may be shown occurring in parallel, it is to be appreciated that these actions could occur substantially in series. While a number of processes are described in relation to example method 300, it is to be appreciated that a greater and/or lesser number of processes could be employed and that lightweight processes, regular processes, threads, and other approaches could be employed. It is to be appreciated that other example methods may, in some cases, also include actions that occur substantially in parallel. Example method 300 and other embodiments may operate in real-time, faster than real-time in a software or hardware or hybrid software/hardware implementation, or slower than real time in a software or hardware or hybrid software/hardware implementation.

While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional methodologies, alternative methodologies, or both can employ additional, not illustrated blocks.

In the flow diagrams, blocks denote "processing blocks" that may be implemented with logic. The processing blocks may represent a method step and/or an apparatus element for performing the method step. The flow diagrams do not depict syntax for any particular programming language, methodology, or style (e.g., procedural, object-oriented). Rather, the flow diagrams illustrate functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

Figure 4:
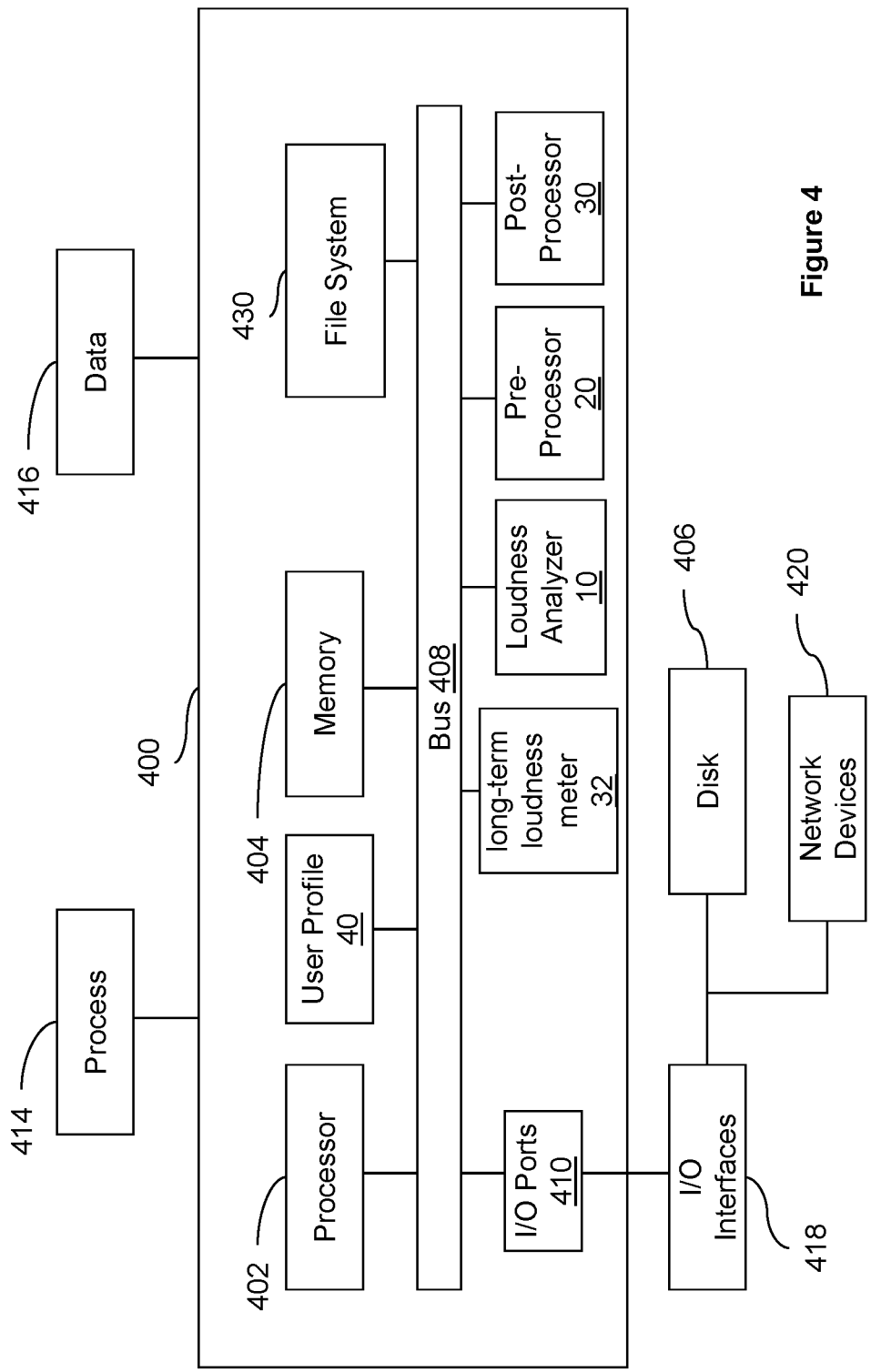
FIG. 4 illustrates a block diagram of an exemplary machine for providing context-aware loudness control of audio content.

FIG. 4 illustrates a block diagram of an exemplary machine 400 for providing context-aware loudness control of audio content. The machine 400 includes a processor 402, a memory 404, file system 430, and I/O Ports 410 operably connected by a bus 408.

In one example, the machine 400 may transmit input and output signals including the audio signals (e.g., audio signal 5, L, R, etc.) described above via, for example, I/O Ports 410 or I/O Interfaces 418. The machine 400 may also include the loudness meter 10, the pre-processor 20, the split 21, the real-time processor 22, the momentary processor 24, the short-term processor 26, the pre-process low 25, the pre-process mid 27, the pre-process high 28, the band mixer 29, the long-term loudness meter 32, the post-processor 30, the digital level processor 36, the profiles menu 40, the high-pass filter 50, the adaptive equalizer 60, and all of their components. Thus, the loudness meter 10, the pre-processor 20, the split 21, the real-time processor 22, the momentary processor 24, the short-term processor 26, the pre-process low 25, the pre-process mid 27, the pre-process high 28, the band mixer 29, the long-term loudness meter 32, the post-processor 30, the digital level processor 36, the profiles menu 40, the high-pass filter 50, the adaptive equalizer 60, may be implemented in machine 400 as hardware, firmware, software, or combinations thereof and, thus, the machine 400 and its components may provide means for performing functions described herein as performed by the loudness meter 10, the pre-processor 20, the split 21, the real-time processor 22, the momentary processor 24, the short-term processor 26, the pre-process low 25, the pre-process mid 27, the pre-process high 28, the band mixer 29, the long-term loudness meter 32, the post-processor 30, the digital level processor 36, the profiles menu 40, the high-pass filter 50, and the adaptive equalizer 60.

The processor 402 can be a variety of various processors including dual microprocessor and other multi-processor architectures. The memory 404 can include volatile memory or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 406 may be operably connected to the machine 400 via, for example, an I/O Interfaces (e.g., card, device) 418 and an I/O Ports 410. The disk 406 can include, but is not limited to, devices like a magnetic disk drive, a solid state disk drive, a floppy disk drive, a tape drive, a Zip drive, a flash memory card, or a memory stick. Furthermore, the disk 406 can include optical drives like a CD-ROM, a CD recordable drive (CD-R drive), a CD rewriteable drive (CD-RW drive), or a digital video ROM drive (DVD ROM). The memory 404 can store processes 414 or data 416, for example. The disk 406 or memory 404 can store an operating system that controls and allocates resources of the machine 400.

The bus 408 can be a single internal bus interconnect architecture or other bus or mesh architectures. While a single bus is illustrated, it is to be appreciated that machine 400 may communicate with various devices, logics, and peripherals using other busses that are not illustrated (e.g., PCIE, SATA, Infiniband, 1394, USB, Ethernet). The bus 408 can be of a variety of types including, but not limited to, a memory bus or memory controller, a peripheral bus or external bus, a crossbar switch, or a local bus. The local bus can be of varieties including, but not limited to, an industrial standard architecture (ISA) bus, a microchannel architecture (MCA) bus, an extended ISA (EISA) bus, a peripheral component interconnect (PCI) bus, a universal serial (USB) bus, and a small computer systems interface (SCSI) bus.

The machine 400 may interact with input/output devices via I/O Interfaces 418 and I/O Ports 410. Input/output devices can include, but are not limited to, a keyboard, a microphone, a pointing and selection device, cameras, video cards, displays 15 and 34, disk 406, network devices 420, and the like. The I/O Ports 410 can include but are not limited to, serial ports, parallel ports, and USB ports.

The machine 400 can operate in a network environment and thus may be connected to network devices 420 via the I/O Interfaces 418, or the I/O Ports 410. Through the network devices 420, the machine 400 may interact with a network. Through the network, the machine 400 may be logically connected to remote devices. The networks with which the machine 400 may interact include, but are not limited to, a local area network (LAN), a wide area network (WAN), and other networks. The network devices 420 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 420 can connect to WAN technologies including, but not limited to, point to point links, circuit switching networks like integrated services digital networks (ISDN), packet switching networks, and digital subscriber lines (DSL). While individual network types are described, it is to be appreciated that communications via, over, or through a network may include combinations and mixtures of communications.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A machine or group of machines for providing real-time context-aware loudness control of audio content, comprising:
   a loudness meter configured to measure loudness of an input audio signal based on a loudness model from a plurality of loudness models and output a real-time loudness measurement of the input audio signal, the loudness model chosen from the plurality of loudness models based on an audio reproduction device to reproduce an output audio signal derived from the input audio signal;
a pre-processor comprising:
   a real-time processor configured to receive and process the real-time loudness measurement of the input audio signal and output a real-time loudness level adjustment;
   a momentary processor configured to receive and process a momentary loudness measurement of the input audio signal from at least one of the loudness meter or the real-time processor, process the momentary loudness measurement of the input audio signal, and output a momentary loudness level adjustment; and
   a short-term processor configured to receive a short-term loudness measurement of the input audio signal from at least one of the loudness meter, the real-time processor, or the momentary processor, process the short-term loudness measurement of the input audio signal, and output a short-term loudness level adjustment;
the pre-processor configured to receive the input audio signal and process the input audio signal based on the real-time loudness level adjustment, the momentary loudness level adjustment, and the short-term loudness level adjustment to output a post-processing input signal;
a long-term loudness meter configured to measure a long-term loudness level of the post-processing input signal and output a long-term loudness measurement of the post-processing input signal;
a post-processor configured to receive and process the long-term loudness measurement of the post-processing input signal to output a post-processing level adjustment; and
a digital level processor configured to receive and process in real-time the input audio signal, the real-time loudness level adjustment, the momentary loudness level adjustment, the short-term loudness level adjustment, and the post-processing level adjustment to output, based on the input audio signal, the real-time loudness level adjustment, the momentary loudness level adjustment, the short-term loudness level adjustment, and the post-processing level adjustment, an overall loudness level adjustment based on which the input audio signal is to be processed to output the output audio signal to be reproduced by the audio reproduction device to match a target loudness average level and a target loudness modulation within a predetermined tolerance.

2. The machine or machines of claim 1, comprising:
an adaptive equalizer configured to receive an audio asset and sound pressure level information from the audio reproduction device and process the audio asset in real-time based on the sound pressure level information to output the input audio signal.

3. The machine or machines of claim 1, comprising:
a profiles menu configured to store settings including the loudness model and to communicate the settings to the loudness meter, the pre-processor, the real-time processor, the momentary processor, the short-term processor, the long-term loudness meter, the post-processor, and the digital level processor such that the loudness meter, the pre-processor, the real-time processor, the momentary processor, the short-term processor, the long-term loudness meter, the post-processor, and the digital level processor perform based on the loudness model.

4. The machine or machines of claim 1, comprising:
a profiles menu configured to store the plurality of loudness models, communicate with the audio reproduction device, and select the loudness model from the plurality of loudness models based on at least one of a kind of the audio reproduction device or a measurement of an environment of the audio reproduction device.

5. A machine or group of machines for providing real-time context-aware loudness control of audio content, comprising:
a loudness meter configured to measure loudness of an input audio signal based on a loudness model to output a real-time loudness measurement of the input audio signal;
a pre-processor comprising:
   a real-time processor configured to receive and process the real-time loudness measurement of the input audio signal and output a real-time loudness level adjustment;
   a momentary processor configured to receive and process a momentary loudness measurement of the input audio signal from at least one of the loudness meter or the real-time processor, process the momentary loudness measurement of the input audio signal, and output a momentary loudness level adjustment; and
   a short-term processor configured to receive a short-term loudness measurement of the input audio signal from at least one of the loudness meter, the real-time processor, or the momentary processor, process the short-term loudness measurement of the input audio signal, and output a short-term loudness level adjustment;
the pre-processor configured to receive the input audio signal and process the input audio signal based on the real-time loudness level adjustment, the momentary loudness level adjustment, and the short-term loudness level adjustment to output a post-processing input signal;
a long-term loudness meter configured to measure a long-term loudness level of the post-processing input signal and output a long-term loudness measurement of the post-processing input signal;
a post-processor configured to receive and process the long-term loudness measurement of the post-processing input signal to output a post-processing level adjustment; and
a digital level processor configured to receive and process the input audio signal, the real-time loudness level adjustment, the momentary loudness level adjustment, the short-term loudness level adjustment, and the post-processing level adjustment to output, based on the input audio signal, the real-time loudness level adjustment, the momentary loudness level adjustment, the short-term loudness level adjustment, and the post-processing level adjustment, an overall loudness level adjustment based on which the input audio signal is to be processed to output an output audio signal to be reproduced by an audio reproduction device to match a target loudness average level and a target loudness modulation within a predetermined tolerance.

6. The machine or machines of claim 5, comprising:
an adaptive equalizer configured to receive an audio asset and sound pressure level information from the audio reproduction device and process the audio asset in real-time based on the sound pressure level information to output the input audio signal.

7. The machine or machines of claim 5, comprising:
a profiles menu configured to store settings including the loudness model and to communicate the settings to the loudness meter, the pre-processor, the real-time processor, the momentary processor, the short-term processor, the long-term loudness meter, the post-processor, and the digital level processor such that the loudness meter, the pre-processor, the real-time processor, the momentary processor, the short-term processor, the long-term loudness meter, the post-processor, and the digital level processor perform based on the loudness model.

8. The machine or machines of claim 5, wherein the loudness meter is configured to measure the loudness of the input audio signal based on a loudness level model chosen from a plurality of loudness level models based on an audio reproduction device to reproduce the output audio signal derived from the input audio signal.

9. The machine or machines of claim 8, comprising:
a profiles menu configured to store the plurality of loudness models, communicate with the audio reproduction device, and select the loudness model from the plurality of loudness models based on at least one of a kind of the audio reproduction device or a measurement of an environment of the audio reproduction device.

10. A method for providing real-time context-aware loudness control of audio content, comprising:
loading a loudness level model chosen from a plurality of loudness level models, the loudness level model chosen from the plurality of loudness models based on an audio reproduction device to reproduce an output audio signal derived from the input audio signal;
measuring a loudness level of the audio content using a loudness meter based on the loudness model from the plurality of loudness models to output real-time loudness measurement of the input audio signal;
receiving and processing the real-time loudness measurement of the input audio signal to output a real-time loudness level adjustment;
receiving and processing a momentary loudness measurement of the input audio signal to output a momentary loudness level adjustment; and
receiving and processing a short-term loudness measurement of the input audio signal to output a short-term loudness level adjustment;
adjusting the input audio signal based on the real-time loudness level adjustment, the momentary loudness level adjustment, and the short-term loudness level adjustment to output a post-processing input signal;
measuring a long-term loudness of the post-processing input signal to output a long-term loudness measurement of the post-processing input signal;
receiving and processing the long-term loudness measurement of the post-processing input signal to output a post-processing level adjustment; and
receiving and processing in real-time the input audio signal, the real-time loudness level adjustment, the momentary loudness level adjustment, the short-term loudness level adjustment, and the post-processing level adjustment to output, based on time the input audio signal, the real-time loudness level adjustment, the momentary loudness level adjustment, the short-term loudness level adjustment, and the post-processing level adjustment, an overall loudness level adjustment based on which the input audio signal is to be processed to output the output audio signal to be reproduced by the audio reproduction device to match a target loudness average level and a target loudness modulation within a predetermined tolerance.

11. The method of claim 10, comprising:
receiving an audio asset and sound pressure level information from the audio reproduction device and processing the audio asset in real-time based on the sound pressure level information to output the input audio signal.

12. The method of claim 10, comprising:
storing settings including the loudness model and communicating the settings such that at least some of the processing is performed based on the loudness model.

13. The method of claim 10, comprising:
selecting the loudness model from the plurality of loudness models based on at least one of a kind of the audio reproduction device or a measurement of an environment of the audio reproduction device.

14. A method for providing real-time context-aware loudness control of audio content, comprising:
measuring a loudness level of the audio content using a loudness meter based on a loudness model to output a real-time loudness measurement of the input audio signal;
receiving and processing the real-time loudness measurement of the input audio signal to output a real-time loudness level adjustment;
receiving and processing a momentary loudness measurement of the input audio signal to output a momentary loudness level adjustment; and
receiving and processing a short-term loudness measurement of the input audio signal to output a short-term loudness level adjustment;
adjusting the input audio signal based on the real-time loudness level adjustment, the momentary loudness level adjustment, and the short-term loudness level adjustment to output a post-processing input signal;
measuring a long-term loudness of the post-processing input signal to output a long-term loudness measurement of the post-processing input signal;
receiving and processing the long-term loudness measurement of the post-processing input signal to output a post-processing level adjustment; and
receiving and processing the input audio signal, the real-time loudness level adjustment, the momentary loudness level adjustment, the short-term loudness level adjustment, and the post-processing level adjustment to output, based on the input audio signal, the real-time loudness level adjustment, the momentary loudness level adjustment, the short-term loudness level adjustment, and the post-processing level adjustment, an overall loudness level adjustment based on which the input audio signal is to be processed to output an output audio signal to be reproduced by an audio reproduction device to match a target loudness average level and a target loudness modulation within a predetermined tolerance.

15. The method of claim 14, comprising:
receiving an audio asset and sound pressure level information from the audio reproduction device and processing the audio asset in real-time based on the sound pressure level information to output the input audio signal.

16. The method of claim 14, comprising:
storing settings including the loudness model and communicating the settings such that at least some of the processing is performed based on the loudness model.

17. The method of claim 14, comprising:
selecting the loudness model from a plurality of loudness models based on at least one of a kind of the audio reproduction device or a measurement of an environment of the audio reproduction device; and
loading the loudness level model.

18. The method of claim 17, comprising:
storing settings including the plurality of loudness models and communicating the settings such that at least some of the processing is performed based on the loudness model.

\* \* \* \* \*